US011959619B2

United States Patent
Ackermann et al.

(10) Patent No.: US 11,959,619 B2
(45) Date of Patent: Apr. 16, 2024

(54) LAMP OR LUMINAIRE COMPRISING A LED MODULE

(71) Applicant: SIGNIFY HOLDING B.V., Eindhoven (NL)

(72) Inventors: Bernd Ackermann, Aachen (DE);
Robert Van Asselt, Valkenswaard (NL);
Daniël Anton Benoy, Geldrop (NL);
Huibert Wouters, Veldhoven (NL);
Wilhelmus Johannes Hendricus Ansems, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/009,389

(22) PCT Filed: Jun. 4, 2021

(86) PCT No.: PCT/EP2021/064984
§ 371 (c)(1),
(2) Date: Dec. 9, 2022

(87) PCT Pub. No.: WO2021/249883
PCT Pub. Date: Dec. 16, 2021

(65) Prior Publication Data
US 2023/0228404 A1    Jul. 20, 2023

(30) Foreign Application Priority Data

Jun. 11, 2020    (EP) ..................................... 20179406

(51) Int. Cl.
*F21V 19/00*    (2006.01)
*F21V 14/00*    (2018.01)
(Continued)

(52) U.S. Cl.
CPC ........ *F21V 19/0025* (2013.01); *F21V 14/006* (2013.01); *F21V 17/04* (2013.01);
(Continued)

(58) Field of Classification Search
CPC .............................. F21V 14/006; H01K 1/181
See application file for complete search history.

(56) References Cited

U.S. PATENT DOCUMENTS

| 8,827,494 B2 | 9/2014 | Bergeron |
| 9,273,853 B2 | 3/2016 | Treanton et al. |

(Continued)

FOREIGN PATENT DOCUMENTS

| DE | 102012003520 A1 | 8/2013 |
| DE | 102016110399 A1 | 12/2016 |

(Continued)

*Primary Examiner* — Zheng Song (57) ABSTRACT

The invention provides a light generating system (1000) comprising a LED module (100), a module support (200), and a connector element (300), wherein: the module support (200) comprises a first module support opening (230) for hosting at least part of a first connector element part (310); the LED module (100) comprises a LED support (120) and a plurality of LEDs (10) functionally coupled to the LED support (120), wherein the LED support (120) comprises a LED support opening (130) for hosting at least part of the first connector element part (310); and wherein the plurality of LEDs (10) are configured to generate light source light (11); the connector element (300) comprises the first connector element part (310), and wherein the first connector element part (310) comprises a first spring part (315); at least part of the first connector element part (310) penetrates through the first module support opening 230); and the LED support opening (130), the first connector element part (310), and the module support (200) are chosen such that in a functional coupling of the LED module (100) and the module support (200), at least part of the first connector (Continued)

element part (310) penetrates through the LED support opening (130), and the first spring part (315) exerts a force on the LED module (100) against the module support (200).

14 Claims, 7 Drawing Sheets

(51) Int. Cl.
*F21V 17/04* (2006.01)
*F21V 21/088* (2006.01)
*F21V 23/06* (2006.01)
*F21Y 115/10* (2016.01)

(52) U.S. Cl.
CPC ............ *F21V 21/088* (2013.01); *F21V 23/06* (2013.01); *F21Y 2115/10* (2016.08)

(56) References Cited

U.S. PATENT DOCUMENTS

| | | | |
|---|---|---|---|
| 2008/0224166 A1* | 9/2008 | Glovatsky | F21S 41/153 257/E33.058 |
| 2012/0295490 A1 | 11/2012 | Schneider | |
| 2014/0064846 A1 | 3/2014 | Van Gompel et al. | |
| 2014/0233227 A1 | 8/2014 | Diekmann et al. | |
| 2015/0198314 A1* | 7/2015 | Frederiksen | F21V 19/0015 362/382 |
| 2015/0244090 A1* | 8/2015 | Mostoller | H01R 12/721 439/81 |
| 2015/0308632 A1* | 10/2015 | Ueno | F21K 9/60 362/249.14 |
| 2015/0369461 A1* | 12/2015 | Yokotani | F21K 9/232 362/382 |
| 2017/0292683 A1* | 10/2017 | Kim | F21V 23/005 |
| 2019/0148860 A1* | 5/2019 | Mason | H05K 3/3436 439/68 |

FOREIGN PATENT DOCUMENTS

| | | | | |
|---|---|---|---|---|
| DE | 202017103516 U1 | | 9/2018 | |
| DE | 102018100634 A1 | | 7/2019 | |
| JP | 2012119624 A | | 6/2012 | |
| KR | 20160053526 A | | 5/2016 | |
| KR | 20170112771 | * | 10/2017 | ............ H05B 47/19 |
| WO | 2017174336 A1 | | 10/2017 | |

* cited by examiner

LAMP OR LUMINAIRE COMPRISING A LED MODULE

CROSS-REFERENCE TO PRIOR APPLICATIONS

This application is the U.S. National Phase application under 35 U.S.C. § 371 of International Application No. PCT/EP2021/064984, filed on Jun. 4, 2021, which claims the benefit of European Patent Application No. 20179406.2, filed on Jun. 11, 2020. These applications are hereby incorporated by reference herein.

FIELD OF THE INVENTION

The invention relates to a light generating system and to a kit of parts comprising such light generating system. The invention also relates to a lamp or a luminaire comprising the light generating system. The invention further relates to a LED module, that may be used in such light generating system.

BACKGROUND OF THE INVENTION

Holder elements and holding bodies in relation to luminaires are known in the art. US2014/0233227, for instance, describes a luminaire, comprising a plurality of lamp holders for mechanically holding and electrically contacting a surface-light lamp in each case, a plurality of flat surface-light lamps having a respective upper flat side, which comprises a luminous area, and a respective underside, which is arranged opposite the upper flat side, wherein each lamp holder is associated with the surface-light lamp and each surface-light lamp, on its underside, in order to establish a mechanical and electrical connection to the associated lamp holder, is designed such that the respective surface-light lamp can be attached via its underside to the respective lamp holder, thus making the electrical contact, and a plurality of elongate holding bodies, which, via their longitudinal ends, can be mechanically fixedly interconnected or are mechanically fixedly interconnected so as to form a holding structure, which is composed of the holding bodies and to which the lamp holders can be fitted or are fitted at regular distances from one another on a common holding structure side.

SUMMARY OF THE INVENTION

There appears to be a desire to easily implement modules, such as LED modules, in e.g. luminaires. Further, there appears to be a desire for late stage replacement. Yet further, there appears to be a desire to simplify connections and/or allow late stage adaptations or adaptations by users.

Hence, it is an aspect of the invention to provide an alternative light generating system, such as a luminaire, which preferably further at least partly obviates one or more of above-described drawbacks. The present invention may have as object to overcome or ameliorate at least one of the disadvantages of the prior art, or to provide a useful alternative.

In a first aspect, the invention provides a light generating system (or "lighting system" or "system") comprising a (LED) module, a module support, and a connector element. Especially, in embodiments the module support comprises a first module support opening for hosting at least part of a first connector element part. Further, in embodiments the (LED) module comprises a (LED) support and one or more solid state light sources, such as LEDs, especially a plurality of LEDs functionally coupled to the (LED) support, wherein the (LED) support comprises a (LED) support opening for hosting at least part of the first connector element part. The plurality of solid state light sources, such as LEDs, are especially configured to generate light source light (such as LED light). The connector element may especially functionally be coupled to the module support. In specific embodiments, the connector element may comprise the first connector element part. Especially, in embodiments the first connector element part comprises a first spring part. Further, in embodiments the first connector element part and the module support may especially be chosen such that in a functional coupling of the connector element and the module support, at least part of the first connector element part penetrates through the first module support opening. Especially, in embodiments the (LED) support opening, the first connector element part, and the module support are chosen such that in a functional coupling of the (LED) module and the module support, at least part of the first connector element part (also) penetrates through the (LED) support opening, and the first spring part exerts a force on the (LED) module against the module support. Therefore, in embodiments the invention provides a light generating system comprising a LED module, a module support, and a connector element, wherein: (a) the module support comprises a first module support opening for hosting at least part of a first connector element part; (b) the LED module comprises a LED support and a plurality of LEDs functionally coupled to the LED support, wherein the LED support comprises a LED support opening for hosting at least part of the first connector element part; and wherein the plurality of LEDs are configured to generate light source light; (c) the connector element comprises the first connector element part, and wherein the first connector element part comprises a first spring part; (d) at least part of the first connector element part penetrates through the first module support opening; and (e) the LED support opening, the first connector element part, and the module support are chosen such that in a functional coupling of the LED module and the module support, at least part of the first connector element part penetrates through the LED support opening, and the first spring part exerts a force on the LED module against the module support.

Such light generating system may amongst others allow several simplifications, e.g. during assembly, and/or more degrees of freedom. For instance, the number of connection elements like screws may be reduced. However, also the number of separate electrical connections may be reduced. Yet further, it may be possible to do late stage modification, for instance of optical elements (e.g. for beam shaping the light emanating from the system). It may also be relatively easy to replace modules and/or optical elements. This may be useful in case a new module is necessary or other optical elements are desired, respectively. For instance, the optical element may be chosen dependent upon the (planned) place or position of use.

Hence, in embodiments the light generating system comprises a LED module, a module support, and a connector element. Of course, the light generating system may comprise more elements, of which some will also be further elucidated below.

Especially, the LED module comprises a light source support and one or more (solid state) light sources, especially a plurality of (solid state) light sources. The term "light source" may refer to a semiconductor light-emitting device, such as a light emitting diode (LEDs), a resonant cavity light emitting diode (RCLED), a vertical cavity laser diode (VCSELs), an edge emitting laser, etc. The term "light source" may also refer to an organic light-emitting diode, such as a passive-matrix (PMOLED) or an active-matrix (AMOLED). In a specific embodiment, the light source comprises a solid state light source (such as a LED or laser diode). In an embodiment, the light source comprises a LED (light emitting diode). The term LED may also refer to a plurality of LEDs. Further, the term "light source" may in embodiments also refer to a so-called chip-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of (essentially identical (or different)) light sources, such as 2-2000 solid state light sources. In embodiments, the light source may comprise one or more micro-optical elements (array of micro lenses) downstream of a single solid state light source, such as a LED, or downstream of a plurality of solid state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering). The phrases "different light sources" or "a plurality of different light sources", and similar phrases, may in embodiments refer to a plurality of solid state light sources selected from at least two different bins. Likewise, the phrases "identical light sources" or "a plurality of same light sources", and similar phrases, may in embodiments refer to a plurality of solid state light sources selected from the same bin.

Here below, the invention is further described in relation to a plurality of LEDs. However, as indicated above, other embodiments may also be possible.

The LEDs are functionally coupled to the LED support. In specific embodiments, the LED may be functionally coupled to a PCB. As known in the art, a printed circuit board ("PCB" or "board") may mechanically support and electrically connect electronic components or electrical components using conductive tracks, pads and other features etched from one or more sheet layers of copper laminated onto and/or between sheet layers of a non-conductive substrate (shortly indicated as "track" or "conductive track").

Hence, in embodiments a PCB may comprise an insulating layer arranged between a substrate and a conductive layer.

An (electronic) component, such as a solid stage light source, may generally be soldered onto the PCB to both electrically connect and mechanically fasten it to the PCB. For instance, a basic PCB may consist of a flat sheet of insulating material and a layer of copper foil, laminated to the substrate. Chemical etching divides the copper into separate conducting lines called tracks or circuit traces, pads for connections, vias to pass connections between layers of copper, and features such as solid conductive areas for EM shielding or other purposes. The tracks function as wires fixed in place, and are insulated from each other by air and the board substrate material. The surface of a PCB may have a coating that protects the copper from corrosion and reduces the chances of solder shorts between traces or undesired electrical contact with stray bare wires. For its function in helping to prevent solder shorts, the coating is called solder resist. Hence, the shape of a PCB may in general be plate-like. Especially, in embodiments the PCB may have a length and a width and a height, wherein an aspect ratio of the length and the height is at least 5, like in the range of 5-5000, like 10-2500, and wherein an aspect ratio of the width and the height is at least 2, such as an aspect ratio of at least 5, like in the range of 5-5000, like 10-2500. The terms "length", "width", and "height" may also refer to "largest length", "largest width", and "largest height", respectively. The PCB may especially have a rectangular cross-section (such as a square cross-section). The height (or thickness) of the PCB may in embodiments be selected from the range of 0.2-10 mm, such as 0.5-5 mm, like 1-2 mm. The width of the PCB may in embodiments be selected from the range of 5-200 mm, such as 5-50 mm. The length of a single printed circuit board area may in embodiments e.g. be selected from the range of 10-50 mm, such as 15-40 mm. The length of the PCB, including a plurality of (connected) PCB areas, may in embodiments e.g. be selected from the range of 20-2000 mm, such as 20-1500 mm. Other dimensions may be possible as well. In embodiments, the board may comprise a rigid board or a semi-rigid board, especially a rigid board. In other embodiments, the board may comprise a semi-rigid board. Especially, the printed circuit board is rigid. In embodiments, the board may comprise a metal, especially a metal selected from the group comprising copper aluminum, tin, iron, silver and lead, more especially a metal selected from the group comprising copper and aluminum. In further embodiments, the (printed circuit) board may have a thermal conductivity of at least 200 W/(m*K), especially at least 250 W/(m*K), such as at least 300 W/(m*K). In specific embodiments, the board may comprise a printed circuit board. Especially, the board may comprise one or more of a CEM-1 PCE, a CEM-3 PCE, a FR-1 PCE, a FR-2 PCB, a FR-3 PCB, a FR-4 PCB, and aluminum metal core PCB, especially one or more of a CEM-1 PCB, a CEM-3 PCB, a FR-1 PCB, and a FR4 PCB and an aluminum metal core PCB, more especially one or more of a CEM-1 PCB, a CEM-3 PCB, a FR-1 PCB.

The functional coupling may especially include a mechanical and electrical coupling. In this way, the solid state light source may be powered via the connector element (and via the LED support).

Especially, the one or more, especially the plurality of LEDs are configured to generate light source light. The light source light may be colored light or white light, though other options may also be possible.

The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source light with a correlated color temperature in the range of 5000-20000 K, even more especially in the range of 6000-20000 K, such as 8000-20000 K. An advantage of the relative high color temperature may be that there may be a relatively high blue component in the light source light.

The terms "visible", "visible light" or "visible emission" and similar terms refer to light having one or more wavelengths in the range of about 380-780 nm.

When two or more light sources are available, in embodiments two or more of the two or more light sources may be individually controlled. For instance, two or more light sources may consist of two or more sets of each one or more light sources, which sets may be individually controlled.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions form a remote control. In embodiments, the control system may be controlled via an App on a device, such as a portable device, like a Smartphone or I-phone, a tablet, etc. The device is thus not necessarily coupled to the lighting system, but may be (temporarily) functionally coupled to the lighting system.

Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, WIFI, LiFi, ZigBee, BLE or WiMAX, or another wireless technology.

The system, or apparatus, or device may execute an action in a "mode" or "operation mode" or "mode of operation". Likewise, in a method an action or stage, or step may be executed in a "mode" or "operation mode" or "mode of operation" or "operational mode". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability).

Hence, in embodiments, the control system may control in dependence of one or more of an input signal of a user interface, a sensor signal (of a sensor), and a timer. The term "timer" may refer to a clock and/or a predetermined time scheme.

Herein, the LED support includes an opening through which part of the first connector may penetrate, and which may push the LED support against the module support (see also below). Hence, in embodiments the LED support comprises a LED support opening for hosting at least part of the first connector element part.

In general, the LED support will be supported by part of a module, such as part of luminaire. In prior art solutions, the LED support may e.g. be screwed to a module support. The module support may e.g. comprise the backside of a light generating device, such as the back side of a luminaire.

Also the module support includes an opening through which part of the first connector may penetrate, and which may push the LED support against this module support. Hence, this may lead to a kind of sandwich structure of at least part of the connector element, the module support and the LED support, and in fact again a (small) part of the connector element, which may push the LED support against this module support. Hence, the module support comprises a first module support opening for hosting at least part of a first connector element part.

In embodiments, the LED module (substrate), the module support, and/or a connector element (substrate) may be plate shaped.

In embodiments, the (average) thickness of the total sandwich structure of the LED module (substrate), the module support, and/or a connector element (substrate) may be less than 20 mm, preferably less than 15 mm, more preferably less than 12 mm, most preferably less than 10 mm.

As indicated above, the system also includes a connector element. The connector element comprises the first connector element part. Especially, in embodiments the connector element comprises a plate shaped part from which the first connector element part extends. The plate shaped part may also be indicated as connector element base ("base"). The plate shaped part may be in physical contact with the module support. The connector element base may also have other shapes than plate-like shaped.

At least part of the first connector element part may be in physical contact with the LED support. Hence, the connector element comprises the first connector element part. Further, in embodiment this first connector element part comprises a first spring part. This spring part may be used to exert a force on the LED support, such that the LED support is pushed against the module support. Further, especially the connector element is functionally coupled to the module support; this will further elucidated below.

Especially, the connector element base may be that part of the connector element that is at the side of the module support opposite of the side of the module support that is in contact with the LED module. The connector element base may in embodiments be a plate shaped element, though it may also have another shape.

As indicated above, at least part of the first connector element part penetrates through the first module support opening. Therefore, in embodiments the first connector element part and the module support are chosen such that in the functional coupling of the connector element and the module support, at least part of the first connector element part penetrates through the first module support opening. Further, as indicated above also at least part of the first connector element part penetrates through the LED support opening. Hence, a first part of the first connector element part may penetrate through the first module support opening, a second part of the first connector element part may penetrate through the LED support opening, and a third part, especially the spring part, may exert a force on the LED support. Therefore, especially the LED support opening, the first connector element part, and the module support are chosen such that in a functional coupling of the LED module and the module support, at least part of the first connector element part (also) penetrates through the LED support opening, and the first spring part exerts a force on the LED module against the module support.

The system may comprise a plurality of connector elements. This may in embodiments imply that the module support comprises a plurality of module support openings. This may in embodiments also imply that the LED support comprises a plurality of LED support openings and/or the system may comprise a plurality of LED supports. Each of the LED supports may comprise one or more LED support openings. A LED module may comprise one or more LED supports. In general, a LED module comprises a single LED support. Especially, the system may comprise at least two connector elements. Further, especially the LED support(s) may (each) comprise one or more, especially at least two, LED support openings.

In specific embodiments, the connector element may comprise more than one first connector element part. Especially, in embodiments the connector element may comprises a single first connector element part.

The first connector element part may have one or more functions selected from the group consisting of pushing the LED module against the module support, preventing movement in at least a direction parallel to module support, facilitating (or providing) an electrical connection with one or more of the LEDs. However, other functions are not excluded. Optionally, the first connector element may also be used to support other elements, such as the below discussed optical element.

Especially, the spring part may limit or prevent a movement of the LED module and module support relative to each other in a direction perpendicular to the module support (or LED module), as the spring parts exert a force on the LED support. Hence, the first connector element may provide a good functional coupling of the module support and LED module. For a good functional coupling of the LED module to the module support, there may also be at least two first connector element parts. In embodiments, these may be provided by two different connector elements. In yet other embodiments, these may be provided by a single connector element (see also further below).

For a good functional coupling, it may also be desirable that the LED support may not move in a direction parallel to the module support. Movement in at least a direction parallel to module support may essentially be prevented with a single first connector element part, though more than one may also be applied. When more than one first connector element parts are applied, then the freedom to move in directions parallel to the module support may further be limited. Alternatively or additionally, the freedom of movement parallel to the module support may also be limited by other elements, such as e.g. other connector element parts (see below in relation to second connector element parts) and/or by an adjacent (second) LED module, which may be configured in (near) physical contact with the LED module.

For the optional electrical contact with the LEDs, a single first connector element part may suffice, though in embodiments at least two first connector element parts may be applied (e.g. for a + and −connection). When at least two first connector element parts are applied for electrical connections (for a single LED module), these at least two first connector element parts may be provided by a single connector element. Especially, however, these at least two first connector element parts may be provided by (at least) two connector elements.

In relation to the possible function of the electrical connection, the LED module may in embodiments be adapted to provide an electrical connection between the connector element, especially the first connector element part, and the LEDs. In specific embodiments, the LED support may further comprise a first LED support electrical conductor in electrical contact with one or more of the plurality of LEDs. Especially, the first connector element part may be electrically conductive. Therefore, in embodiments in the functional coupling of the connector element and the module support, the first connector element part may be in electrical contact with one or more of the plurality of LEDs via the first LED support electrical conductor. Hence, especially in embodiments the LED support further comprises a first LED support electrical conductor in electrical contact with one or more of the plurality of LEDs, wherein the first connector element part is electrically conductive, and wherein in the functional coupling of the connector element and the module support the first connector element part is in electrical contact with one or more of the plurality of LEDs via the first LED support electrical conductor. The obtained effect is improved easily replaceable LED modules, in e.g. luminaires. Further, it allows for late-stage replacement LED modules. Yet further, this configuration further simplifies connections and/or allow late-stage adaptations in LED modules.

In specific embodiments, the connector element may comprise two first connector element parts, which may be in electrical conductive contact with each other, wherein one of the first connector element parts is in physical (and electrical) contact with a first LED module, and another one of the first connector element parts is in physical (and electrical) contact with a second LED module. Such connector element may electrically connect two LED modules. Hence, in embodiments wherein two first connector element parts penetrate through two LED support openings on one LED module, these two first connector element parts may be from two different connector elements.

As can be derived from the above, especially the first connector element part is used to keep the LED module and module support in a functional coupling. Thereby, a functional coupling is provided between the LED module, the module support and the connector element. Hence, in fact the connector element and the module support may also have a functional coupling.

For a good functional connection of the connector element to the module support, it may be desirable to use a connector element including not only the first connector element part, but also including one or more other connector element parts. In order to distinguish these from the first connector element parts, these other connector element parts are herein indicated as second connector element part.

Such second connector element part may have one or more functions selected from the group consisting of pushing the module support against at least part of the connector element, preventing movement of the module support and connector element relative to each other in at least one direction parallel to module support, facilitating (or providing) an electrical connection with an electrical power source, and facilitating (or providing) support for other elements (such as optics, see below).

One or more of these functions may also be provided by the first connector element part, or one or more of these may in fact be provided by the first connector element part, but by providing the second connector element part overlapping functions may be improved (such as preventing movements) and non-overlapping functions may be separated, which may e.g. reduce complexity and/or have advantages in view of the optical properties, and/or which may reduce effects that one function may be fulfilled while complicating another function. For instance, would the first connector element part be used for an electrical connection with the LEDs and with an external source of power, this might complicate the construction of the connector element and/or may complicate the construction of the spring part. Or, would the first connector element part also be used for facilitating (or providing) support for other elements, this may in embodiments lead to optical losses.

Hence, in embodiments the connector element comprises one or more second connector element parts.

Especially, in embodiments the one or more second connector element parts each comprise resilient second part.

Further, in embodiments the module support may comprise one or more second module support openings for hosting at least parts of one or more second connector element parts.

Especially, at least part of the one or more second connector element parts penetrates through the one or more second module support openings. Further, especially the one or more resilient second parts may prevent a movement of the connector element and the module support relative to each other in a direction perpendicular to the connector element or the module support. Therefore, in specific embodiments the one or more second module support openings, the one or more second connector element parts, and the one or more resilient second parts are chosen such that in a functional coupling of the connector element and the module support: (i) at least part of the one or more second connector element parts penetrate through the one or more second module support openings, and (ii) the one or more resilient second parts prevent a movement of the connector element and the module support relative to each other in a direction perpendicular to the connector element or the module support.

Especially, the resilient second part of the second connector element may limit or prevent a movement of the connector element and module support relative to each other in a direction perpendicular to the module support (or connector element). In embodiments, the resilient second part may exert a force on the module support (thereby pushing the module support against part of the connector element) and/or block a movement away from each other in a direction perpendicular to the module support or connector element (base). Hence, the second connector element may provide a good functional coupling of the module support and connector element. For a good functional coupling of the connector element to the module support, there may also be at least two second connector element parts. In embodiments, these may be provided by two different connector elements. In yet other embodiments, these may be provided by a single connector element (see also further below). More especially, there may be at least two sets of at least two second connector element parts. In embodiments, these may especially be provided by two different connector elements.

For a good functional coupling, it may also be desirable that the module support may not move in a direction parallel to the connector element. Movement in at least a direction parallel to connector element may essentially be prevented with a single second connector element part, though more than one may also be applied. When more than one second connector element parts are applied, then the freedom to move in directions parallel to the connector element may further be limited.

In relation to the possible function of the electrical connection, the second connector element may e.g. allow an electrical connection with an electrical power source. Hence, in embodiments the second connector element part may be electrically conductive and is configured in an electrically conductive connection with the first connector element part (which may thus also be electrically conductive). Further, in embodiments the second connector element part may comprise an electrical connector element. In embodiments, the electrical connector element may be selected from the group consisting of a plug and a socket. Therefore, in embodiments the second connector element part may be electrically conductive and may be configured in an electrically conductive connection with the first connector element part, wherein the second connector element part may comprise an electrical connector element, wherein the electrical connector element may be selected from the group consisting of a plug and a socket. Especially, the electrical connector element may comprise a plug such as a (Faston) female electrical terminal. However, other electrical connections may also be possible, such as with electrically conductive snap fit connections, poke-in connections, slide-in connections (e.g. edge card or ZIF ("zero insertion force")), or mechanical clamping, etc.

When a single connector element comprises two or more second connector element parts, in embodiments only one of them may have this functionality. However, in specific embodiments, each of them may have this functionality. This may allow an easier production.

As indicated above, second connector element part may facilitate (or provide) support for other elements (such as optics, see below). In such embodiments, the second connector element part may e.g. comprise snap fit connections for such optics, or other connections, especially mechanical connections, like mechanical clamping, click connections, spring connections, insert-slide connections, etc. Especially, in embodiments the optical element and the one or more of the one or more second connector element parts may comprise a click-connection. See further also below.

In view of preventing movement of the connector element and module support relative to each other and/or in view of facilitating (or providing) support for other elements (such as optics), it may be desirable to use a connector element comprising at least two second support element parts. Hence, in specific embodiments the connector element comprises at least two second connector element parts.

Especially, in embodiments the connector element comprises a plate shaped part (see also above) from which the second connector element part(s) extend(s).

Therefore, in specific embodiments the connector element may comprise a plate shaped part from which the first connector element part and the at least two second connector element parts extend.

Therefore, in yet a further aspect the invention also provides the connector element as such. Especially, in an aspect the invention provides a connector element comprising a part ("base"), such as a plate shaped part, from which at least a first connector element part and at least two second connector element parts extend. Such connector element may be functionally coupled to the module support. Hence, the connector element may be designed for a specific module support, with which it may form a click connection. The functional coupling, such as via a click connection, may lead to a configuration wherein the connector element, especially the plate shaped part, may essentially not be movable relative to the module support.

The module support may comprise at least a first module support opening and at least two second module support openings. Especially, the module support may comprise at least two sets of openings, wherein each set comprises at least a first module support opening and at least two second module support openings.

Therefore, in yet a further aspect the invention also provides a module support comprising one or more sets of openings, wherein each set comprises at least a first module support opening and at least two second module support openings. Hence, the module support may be designed for a specific connector element (and LED module), with which it may form a click connection. The functional coupling, such as via a click connection, may lead to a configuration wherein the module support may essentially not be movable relative to the connector element, more especially the plate shaped part (base).

As can be derived from above, the dimensions of the LED module, the position of the LED support opening, the position of the first connector element part, and the position of the second connector element part(s), may be chosen such that the first connector element part penetrates through both the module support and the LED support, and the second connector element part only penetrates through the module support.

Especially, in embodiments the at least two second connector element parts are configured at both sides of the LED module. This may e.g. be useful for connecting e.g. optics to the second connector element parts.

In embodiments of the light generating system, the system may comprise a plurality n of connector elements functionally coupled to a module support and one or more, especially a plurality of m LED modules. Especially, m≥1 and n≥1. The number m and n are natural numbers (larger than 0). Even more especially, m>n. In specific embodiments m*2≤n≤m*8. Yet further, in specific embodiments when there are a plurality of connector elements, their pitch may be selected from the range of 2-50 cm, such as selected from the range of 4-30 cm, such as 5-20 cm.

In specific embodiments the light generating system may further comprise an optical element configured to beam shape and/or beam direct the light source light of one or more of the plurality of light sources.

In embodiments, the optical element comprises a diffusor element, such as a diffusor plate. In embodiments, the optical element may comprise a plurality of lenses, such as a lens plate comprising a plurality of lenses. In embodiments, the optical element may comprise a plurality of micro lenses (MLO), such as a micro lens plate comprising a plurality of micro lenses. Hence, in embodiments the optical element may comprise a plurality of beam shaping elements configured to beam shape the light source light of two or more of the plurality of light sources.

The optical element is especially configured downstream of one or more, especially a plurality, of light sources (such as LEDs). The terms "upstream" and "downstream" relate to an arrangement of items or features relative to the propagation of the light from a light generating means (here especially the light source), wherein relative to a first position within a beam of light from the light generating means, a second position in the beam of light closer to the light generating means is "upstream", and a third position within the beam of light further away from the light generating means is "downstream". Hence, the light source light of a plurality of light sources may be transmitted through a single optical element.

As indicated above, especially the optical element may be supported by one or more of the one or more second connector element parts.

As can be derived from above, the dimensions of the LED module, the position of the LED support opening, the position of the first connector element part, and the position of the second connector element parts, may be chosen such that at least two second connector element parts are configured at both sides of the LED module. This may allow a relatively easy (late-stage) configuration of the optical element (downstream of a plurality of LEDs).

In embodiments, the system may comprise a plurality of optical elements. In yet further specific embodiments, the system may comprise a plurality of optical elements comprising two or more different optical elements. For instance, the beam shaping may vary over the length of the series of optical elements. When there are two or more optical elements, the optical elements may especially configured close to each other such as within 1 cm, or be configured in physical contact. In specific embodiments, wherein the system comprises a plurality of LED modules, downstream of each LED module 1-4 optical elements (especially in a 1D array, though in specific embodiments this may also be a 2D array), such as a single optical element, may be configured. Especially, the optical element is configured parallel to the LED module (and the module support).

For assembling the lighting system, or at least part thereof, the connector element part(s) may be configured through the module support opening(s). This may be obtained by pushing the module support over the connector element part(s) in a first direction, while the connector element(s) protrude the module support opening(s). Of course, this is essentially equivalent with moving the connector element in a second direction (anti-parallel to the first direction) against the module support, while the second connector element(s) protrude the module support opening(s). During this movement, the resilient second part may first be pushed in a direction of at least part of the second connector element part and about when the module support gets in physical contact with the connector element base, may be freed from the module support opening and get in physical contact with a first side of the module support and exerts a force on the module support in a direction of the connector element base and/or block a movement away from each other in a direction perpendicular to the module support or connector element base.

Then, the LED module, more especially the LED support, may be pushed over the first connector element part(s) in a direction essentially parallel to this first direction, while the first connector element(s) protrude the LED support opening(s). Of course, this is essentially equivalent with pushing the first connector element in a second direction (anti-parallel to the first direction) against the LED support, while the first connector element(s) protrude the LED support opening(s). During this movement, the first spring part may first be pushed in a direction of at least part of the first connector element part and about when the LED module gets in physical contact with the module support, may be freed from the LED support opening and get in physical contact with a first side of the LED support and exerts a force on the LED support in a direction of the module support.

Then, the LED module may be moved in a direction parallel to the module support until it reaches a stop element. A movement back may be prevented in several ways, including e.g. click elements and/or the arrangement of a second LED module, which may be arranged in physical contact with the earlier arranged LED module.

Hence, in embodiments the functional coupling of the LED module to the module support is obtainable by a coupling including a sliding movement until physical contact with a stop element. In specific embodiments, the first connector element part comprises the stop element. Yet further, the first connector element part may be the stop element. Especially, in embodiments the functional coupling of the LED module to the module support may be obtainable by a coupling including the sliding movement in a single predefined direction until physical contact with the stop element.

As indicated above, a kind of sandwich structure may be obtained. Hence, in embodiments the module support may comprise a first face, directed to the LED module, and a second face directed away from the LED module. A first part of the connector element, which may also be indicated as connector element base, may especially be configured in physical contact with the second face of the module support.

The module support may e.g. be of aluminum or stainless steel, though other materials may also be possible. Hence, such material may be electrically conductive, unless specific measures are taken. Would the connector element be electrically conductive (see also above), such measures may be useful. Hence, either the module support may not be of electrically conductive material, or specific measures are taken. For instance, aluminum may be anodized, to provide the aluminum with an essentially electrically insulating coating. Steel may e.g. be powder coated, to provide steel with an essentially electrically insulating coating.

Hence, in specific embodiments the module support comprises a first face directed to the LED module and a second face directed away from the LED module, wherein a first part of the connector element is configured in physical contact with the second face of the module support, wherein there is no electrical contact between the connector element and the module support.

In yet a further aspect, the invention also provides a lamp or a luminaire comprising the light generating system as defined herein. The lamp or luminaire may comprise a housing. In specific embodiments, at least part of the housing may be provided by the module support. The luminaire may further comprise louvres, etc . . . The lamp or luminaire may comprise a light window in the housing or a housing opening, through which the at least part of the light source light may escape from the housing. The light emanating from the system may be indicated as system light, and may comprise at least part of the light source light.

As indicated above, it may be desirable to choose specific optical elements dependent upon the planed or installed application. Hence, in yet a further aspect the invention also provides a kit of parts comprising the light generating system as defined herein and one or more optical elements, especially two or more different optical elements, especially configured to provide different beam shapes and/or beam directions.

Further, as indicated above the LED module may be adapted for the specific application as described herein. Hence, in yet a further aspect the invention also provides a LED module comprising a LED support and a plurality of LEDs functionally coupled to the LED support, wherein the LED support comprises a LED support opening for hosting at least part of a first connector element part; wherein the plurality of LEDs are configured to generate light source light; and wherein the LED support further comprises a first LED support electrical conductor in electrical contact with one or more of the plurality of LEDs. In specific embodiments, at least part of the first LED support electrical conductor is configured within 10 mm from the LED support opening, such as within about 5 mm, like within about 2 mm, such as within a range of about 0.2-2 mm, like 0.5-2 mm. The obtained effect is improved easily replaceable LED modules, in e.g. luminaires. Further, it allows for late-stage replacement LED modules. Yet further, this configuration further simplifies connections and/or allow late-stage adaptations in LED modules.

The light generating system may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting.

Herein, the term "functionally coupled" may in embodiments refer to a physical connection or mechanical connections between at least two elements, such as via one or more of a screw, a solder, an adhesive, a melt connection, etc. Alternatively or additionally, the term "functionally coupled" may in embodiments refer to an electrical conductive connection between at least two connections. When two (or more) elements have an electrical conductive connection, then there may be a conductivity (at room temperature) between the two (or more) elements of at least $1 \cdot 10^5$ S/m, such as at least $1 \cdot 10^6$ S/m. In general, an electrically conductive connection will be between two (or more) elements each comprising an electrically conductive material, which may be in physical contact with each other or between which an electrically conductive material is configured.

Herein a conductivity of an insulated material may especially be equal to or smaller than $1 \cdot 10^{-10}$ S/m, especially equal to or smaller than $1 \cdot 10^{-13}$ S/m. Herein a ratio of an electrical conductivity of an isolating material (insulator) and an electrical conductivity of an electrically conductive material (conductor) may especially be selected smaller than $1 \cdot 10^{-15}$.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

Figure 1A:
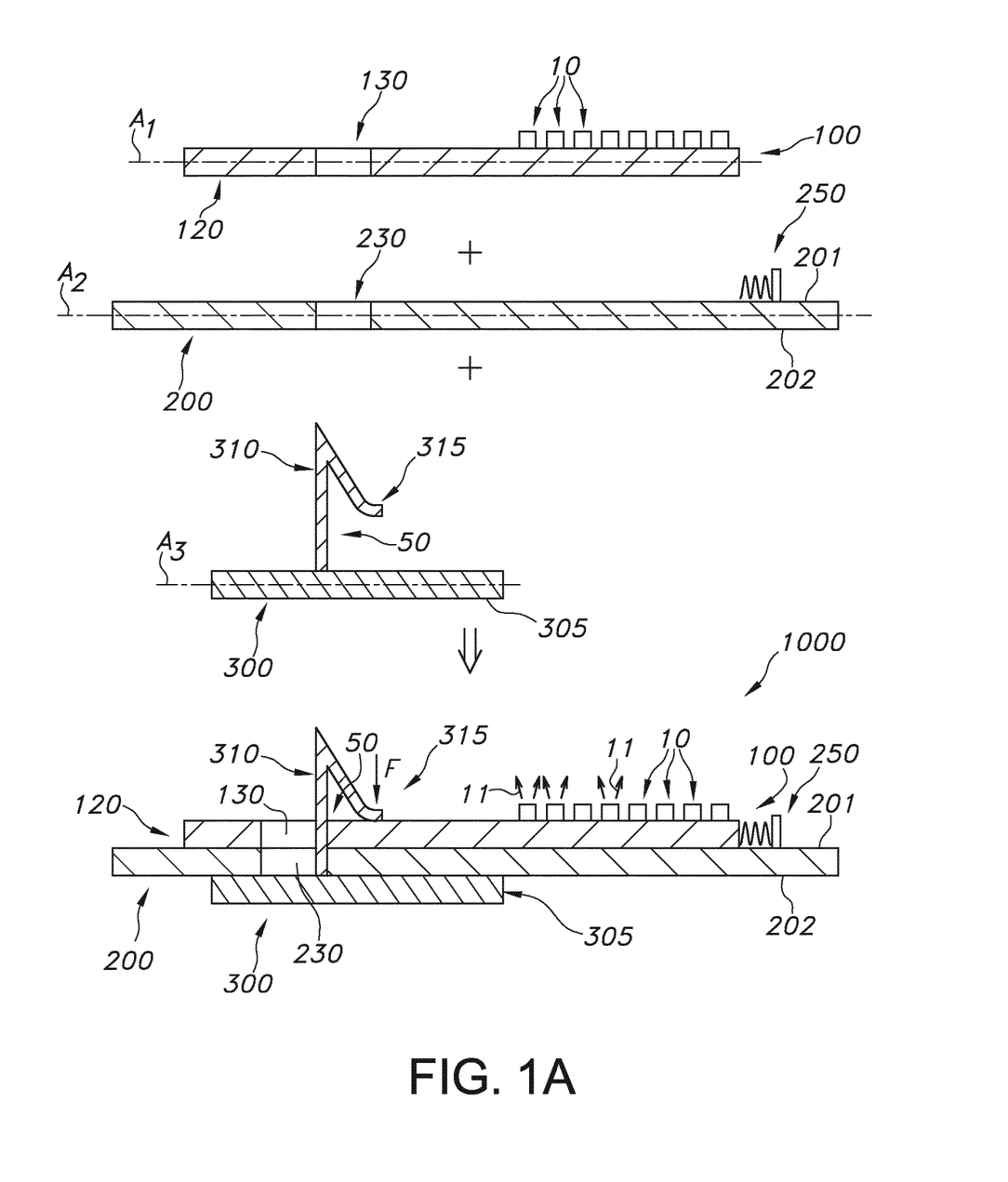
FIGS. 1a-1h schematically depict some embodiments.

FIG. 1a schematically depicts a light generating system 1000 and its separate components, which can be assembled into the light generating system. FIG. 1a schematically depicts a side view or cross-sectional view.

As schematically depicted, the light generating system 1000 comprises a LED module 100, a module support 200, and a connector element 300. Assembled together, they provide the light generating system 1000, see lowest drawing in FIG. 1a.

The module support 200 comprises a first module support opening 230 for hosting at least part of a first connector element part 310.

The LED module 100 comprises a LED support 120 and one or more, especially a plurality of LEDs 10 functionally coupled to the LED support 120. The LED support 120 comprises a LED support opening 130 for hosting at least part of the first connector element part 310. Especially, the plurality of LEDs 10 are configured to generate light source light 11 (during operation of the light generating device 1000).

In the final assembled light generating system 1000, the connector element 300 is functionally coupled to the module support 200. The connector element 300 comprises the first connector element part 310, and the first connector element part 310 comprises a first spring part 315. As schematically depicted, the connector element 300 comprises a base element 305, such as a plate shaped base element 305, from which the first connector element part 310 extends.

Especially, the first connector element part 310 and the module support 200 may be chosen such that in the functional coupling of the connector element 300 and the module support 200, at least part of the first connector element part 310 penetrates through the first module support opening 230.

The LED support opening 130, the first connector element part 310, and the module support 200 may (also) be chosen such that in a functional coupling of the LED module 100 and the module support 200, at least part of the first connector element part 310 (also) penetrates through the LED support opening 130, and the first spring part 315 exerts a force on the LED module 100 against the module support 200. The force is indicated with reference F.

For assembling the lighting system 1000, or at least part thereof, the connector element part(s) may be configured through the module support opening(s). This may be obtained by pushing the module support over the connector element part(s) in a first direction, while the connector element(s) protrude the module support opening(s). During this movement, the resilient second part may first be pushed in a direction of at least part of the second connector element part and about when the module support gets in physical contact with the connector element base, may be freed from the module support opening and get in physical contact with a first side of the module support and exerts a force on the module support in a direction of the connector element base and/or block a movement away from each other in a direction perpendicular to the module support or connector element base.

Then, the LED module 100, more especially the LED support 120, may be pushed over the first connector element part(s) in a direction essentially parallel to this first direction, while the first connector element(s) protrude the LED support opening(s). During this movement, the first spring part may first be pushed in a direction of at least part of the first connector element part and about when the LED module gets in physical contact with the module support, may be freed from the LED support opening and get in physical contact with a first side of the LED support and exerts a force on the LED support in a direction of the module support.

Then, the LED module 100 may be moved in a direction parallel to the module support until it reaches a stop element. A movement back may be prevented in several ways, including e.g. click elements and/or the arrangement of a second LED module, which may be arranged in physical contact with the earlier arranged LED module, and/or a stop element.

Hence, in embodiments the functional coupling of the LED module 100 to the module support 200 is obtainable by a coupling including a sliding movement until physical contact with a stop element 50. In specific embodiments, the first connector element part 310 comprises the stop element 50. Yet further, the first connector element part 310 may be the stop element. Especially, in embodiments the functional coupling of the LED module 100 to the module support 200 may be obtainable by a coupling including the sliding movement in a single predefined direction until physical contact with the stop element 50.

Also other stop elements may be available. As indicated above, click elements may be used to provide a fixed position of the LED support on the module support, thereby preventing a movement of the LED support in at least one direction parallel to the module support. FIG. 1a also schematically depicts a further stop element, here indicated with reference 250, which may also prevent movement in at least one direction parallel to the module support 200. This stop element 250 may e.g. comprise a spring element. This stop element 250 may be functionally coupled to the module support 200.

References A1, A2, and A3 refer to axes of elongation or planes, parallel to the respective displayed elements. In the system 1000, these axes of elongation or planes may be essentially planar. In general, the height H1 of the base element 305 is smaller than its length L1 or width W1 (see also FIG. 1b). Especially, L1>2*H1 and W1>2*H1, especially L1>5*H1 and W1>5*H1. In general, the height H2 of the module support 200 is smaller than its length L2 or width W2 (see also FIG. 1b). Especially, L2>2*H2 and W2>2*H2, especially L2>5*H2 and W2>5*H2. In general, the height H3 of the LED support 120 is smaller than its length L3 or width W3 (see also FIG. 1b). Especially, L3>2*H3 and W3>2*H3, especially L3>5*H3 and W3>5*H3. Hence, in embodiments these may all be plate shaped elements. H1, H2, H3, and W1, W2, and W3, and L1, L2, and L3 are not depicted.

Figure 1B:
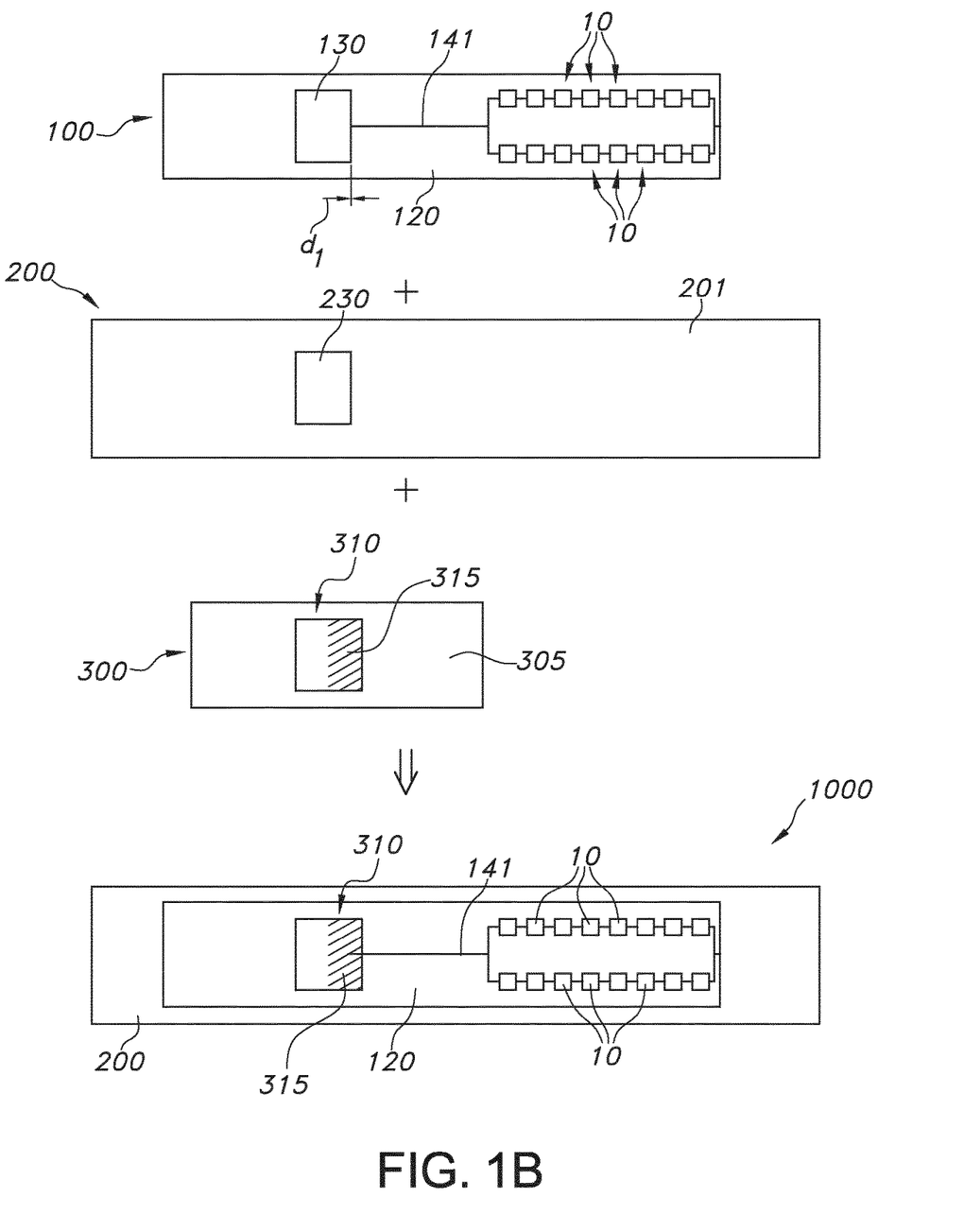

FIG. 1b schematically depicts a top view of essentially the same system and assembly as shown in FIG. 1a. In addition to that, FIG. 1b schematically depicts an embodiment wherein the LED support 120 further comprises a first LED support electrical conductor 141 in electrical contact with one or more of the plurality of LEDs 10. The first connector element part 310 is electrically conductive. In the functional coupling of the connector element 300 and the module support 200, see lowest drawing, the first connector element part 310 is in electrical contact with one or more of the plurality of LEDs 10 via the first LED support electrical conductor 141.

A second electrical connection is not shown, but could be made in a similar way, or via other ways.

FIG. 1b also schematically depicts an embodiment of a LED module 100, as such, comprising a LED support 120 and a plurality of LEDs 10 functionally coupled to the LED support 120. The LED support 120 comprises a LED support opening 130 for hosting at least part of a first connector element part 310. The plurality of LEDs 10 are configured to generate light source light. The LED support 120 further comprises a first LED support electrical conductor 141 in electrical contact with one or more of the plurality of LEDs 10. At least part of the first LED support electrical conductor 141 is configured within a distance d1 10 mm from the LED support opening 130.

FIG. 1b schematically depicts a top view.

Figure 1C:
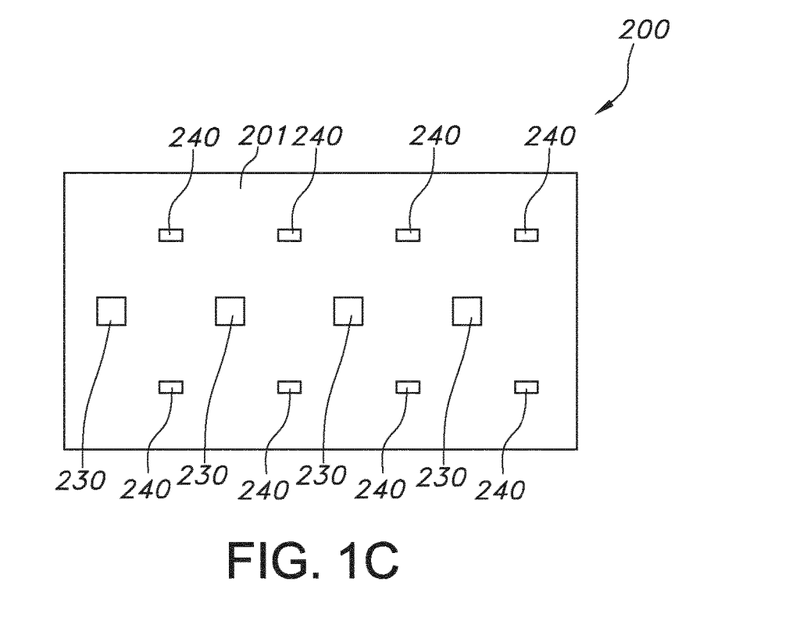

FIG. 1c schematically depicts an embodiment of the module support 200 comprising one or more second module support openings 240 for hosting at least parts of one or more second connector element parts (see below).

Figure 1D:
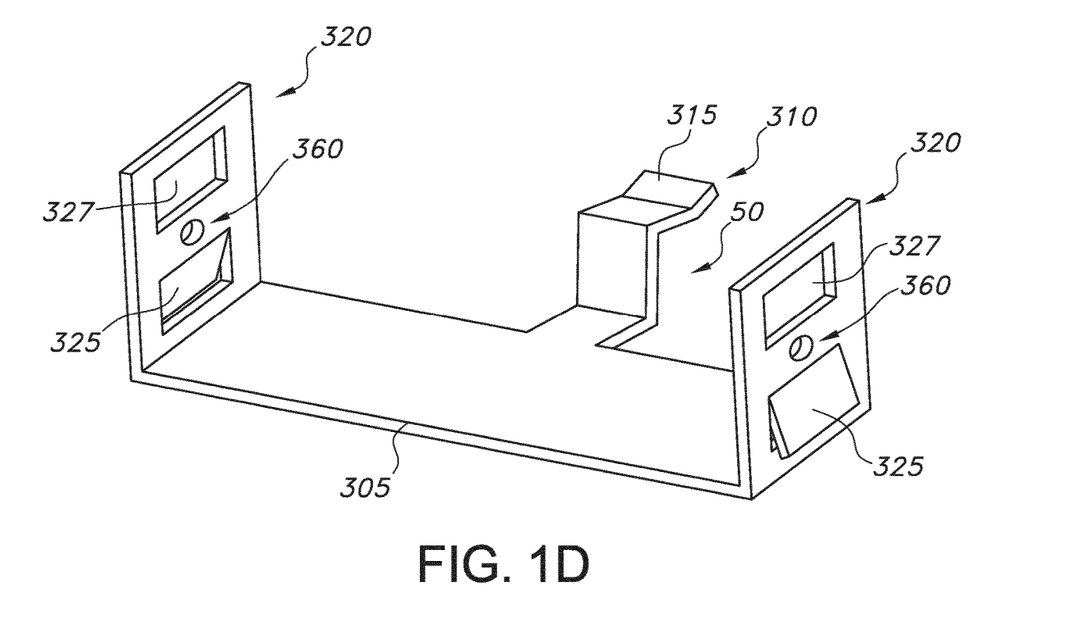

FIG. 1d schematically depicts an embodiment of the connector element 300 comprising the one or more second connector element parts 320, wherein the one or more second connector element parts 320 each comprise resilient second part 325. Especially, an embodiment is depicted wherein the connector element 300 comprises at least two second connector element parts 320. Further, FIG. 1d schematically depicts an embodiment of the connector element 300 comprising a plate shaped part 305 from which the first connector element part 310 and the at least two second connector element parts 320 extend.

Referring to FIG. 1d, the schematically depicted embodiment may include a second connector element part 320 that is electrically conductive and is configured in an electrically conductive connection with the first connector element part 310. The second connector element part 320 comprises an electrical connector element 360, wherein the electrical connector element 360 may be selected from the group consisting of a plug and a socket. Here, a simplified version of a socked electrical connector element 360 is schematically depicted. FIG. 1d also schematically depicts a connector element 327, which may e.g. be a male or female connector element (here a female connector elements), for a functional coupling with another connector element, such as a female or male connector element of another item, such as an optical element (see also below). The connect element 300 may also be indicated as "bracket". The connector element 300 may in embodiments be of steel or aluminum.

Figure 1E:
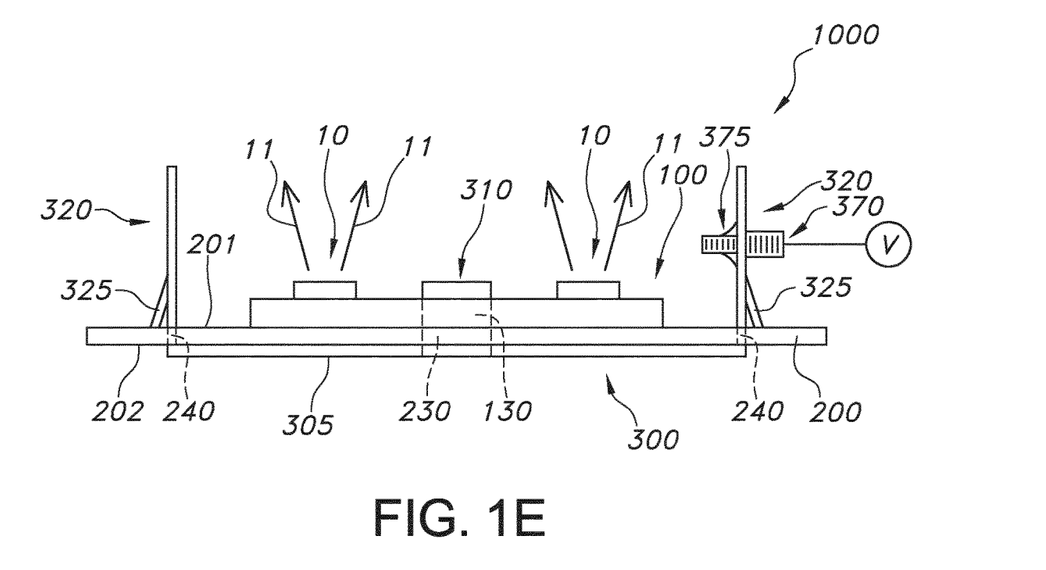

FIG. 1e schematically depicts an embodiment of the light generating system 1000. In this schematically depicted embodiment the module support 200 comprises one or more second module support openings 240 for hosting at least parts of one or more second connector element parts 320 (see also FIG. 1c). Further, the connector element 300 comprises the one or more second connector element parts 320, wherein the one or more second connector element parts 320 each comprise resilient second part 325 (see FIG. 1d). Especially, the one or more second module support openings 240, the one or more second connector element parts 320, and the one or more resilient second parts 325 are chosen such that in a functional coupling of the connector element 300 and the module support 200 (i) at least part of the one or more second connector element parts 320 penetrate through the one or more second module support openings 240, and (ii) the one or more resilient second parts 325 prevent a movement of the connector element 300 and the module support 200 relative to each other in a direction perpendicular to the connector element 300 or the module support 200.

FIG. 1e also schematically depicts an electrical connection of one of the second connector elements 320 via a counter electrical connector element 370, such as a plug. This counter connector element 370 may include one or more resilient members 375 to keep the counter electrical connector element 370 in the socket electrical connector element 360 (see FIG. 1d). In this way, an external source of electrical power (V) may be used to provide power to the light sources 10 via the connector element 300, see further also e.g. the embodiment of FIG. 1b.

In embodiments, the at least two second connector element parts 320 are configured at both sides of the LED module 100. In embodiments, at least two rows of LEDs may be configured on the LED module 100 between the (at least) two second connector element parts 320 of at least a single connector element 300.

Figure 1F:
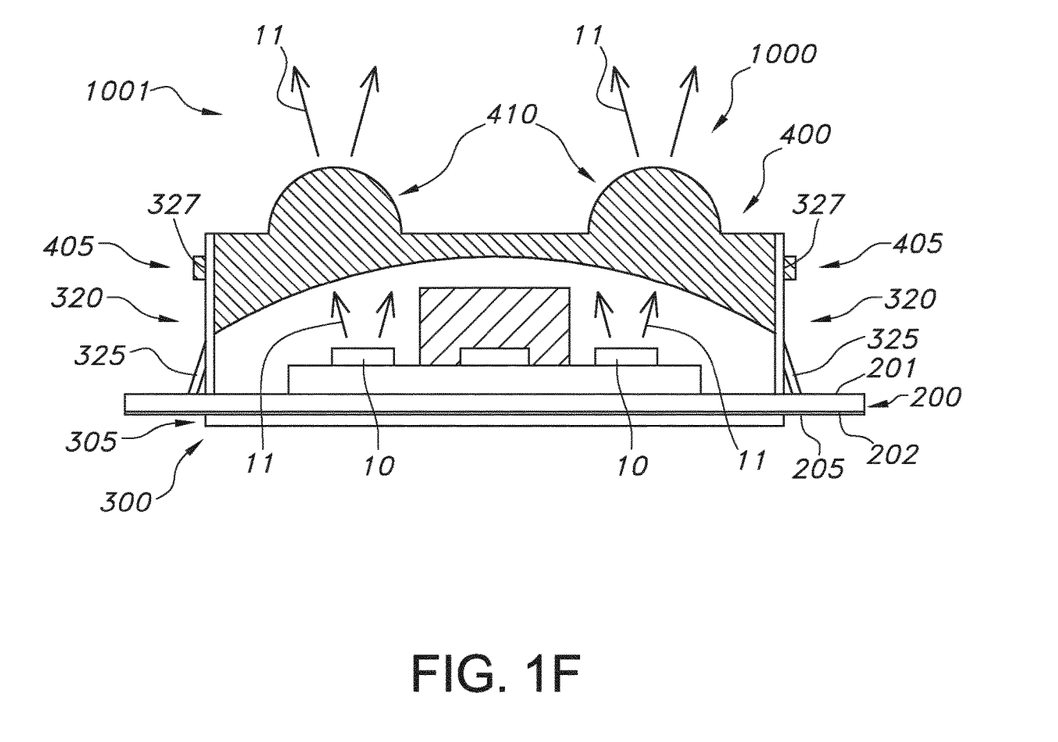

Referring to FIG. 1f, the light generating system 1000 may further comprise an optical element 400 configured to beam shape and/or beam direct the light source light 11 of one or more of the plurality of light sources 10. Here, the optical element 400 comprises a plurality of beam shaping elements 410 configured to beam shape the light source light 11 of one or more, especially two or more, of the plurality of light sources 10.

As schematically depicted, in embodiments the optical element 400 is supported by one or more of the one or more second connector element parts 320. For instance, the optical element 400 and the one or more of the one or more second connector element parts 320 may comprise a click-connection. Reference 405 indicates an element of the optical element, such as an extension, that can be used in a click connection. Hence, reference 405 refers to an element for a click connection, but may also be any other male or female element for creating a connection (with the second connector element part 320).

Alternatively or additionally, in embodiments the optical element 400 may be supported by one or more of the one or more first connector element parts 310 (not depicted).

As schematically depicted, the module support 200 may comprise a first face 201 directed to the LED module 100 and a second face 202 directed away from the LED module 100. A first part 305 of the connector element 300 is configured in physical contact with the second face 202 of the module support 200. Especially, there is no electrical contact between the connector element 300 and the module support 200. For instance, this may be obtained with a coating 205. The coating may e.g. be a powder coating comprising an insulating material or may be the result of anodizing.

Figure 1G:
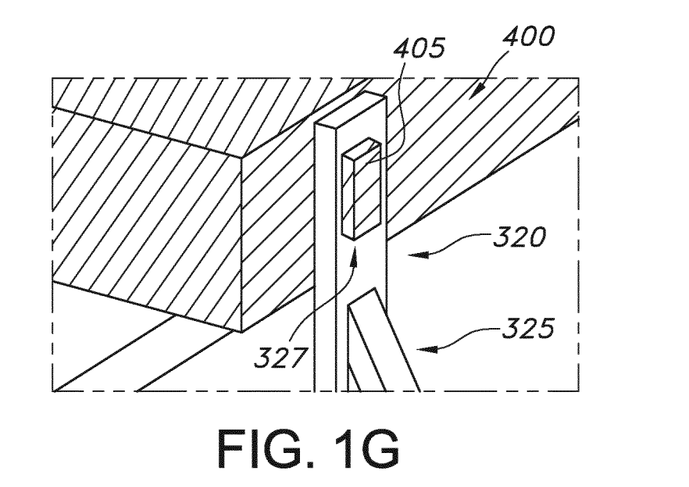

FIG. 1g schematically depicts in a bit more detail a possible connection between the optical element 400 for a (click) connection, with the second connector element part 320, more especially its counterpart connector element 327. To this end, a connector element 405, such as an extension of the optical element 400, may be inserted in the counterpart connector element 327, which may be an opening in the second connector element part 320. This may provide e.g. a click connection. As indicated above, optionally (also) the first connector element part 310 may be used to support the optical element 400.

Figure 1H:
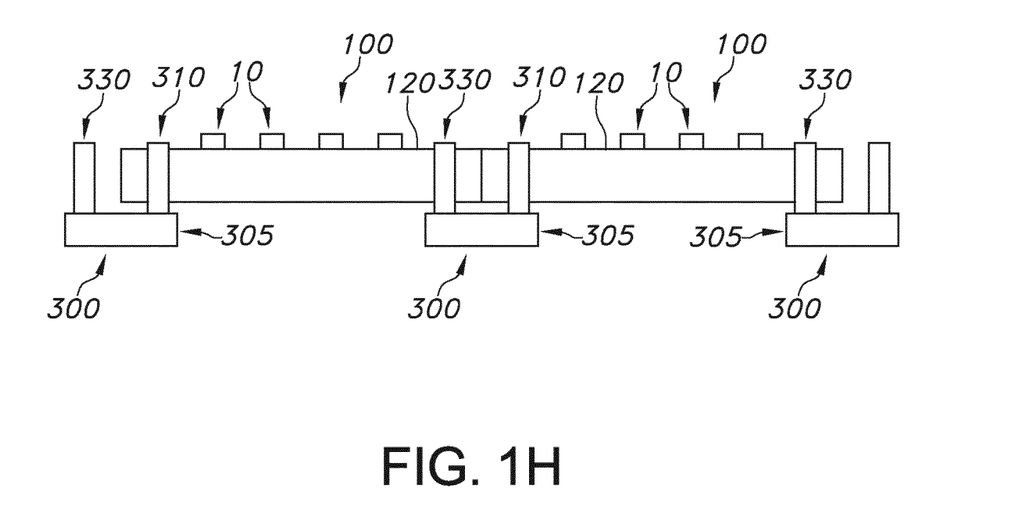

FIG. 1h schematically depicts an embodiment, wherein only connector elements 300, and LED modules 100 are depicted. For the sake of clarity, the module support is not depicted. Here, the connector elements 300 are used to couple (at least) two LED modules 100. To this end, the connector elements 300 may comprise the first connector element part 310 but may also comprise a further (first) connector element part, indicated with reference 330. For instance, in this way two (or more) LED modules may also be electrically coupled. For instance, the LED modules 100 may be configured in series. Of course, other solutions may also be possible. Hence, in embodiments the connector element may comprise two first connector element parts, which may be in electrical conductive contact with each other, wherein one of the first connector element parts is in physical (and electrical) contact with a first LED module, and another one of the first connector element parts is in physical (and electrical) contact with a second LED module.

Figure 2A:
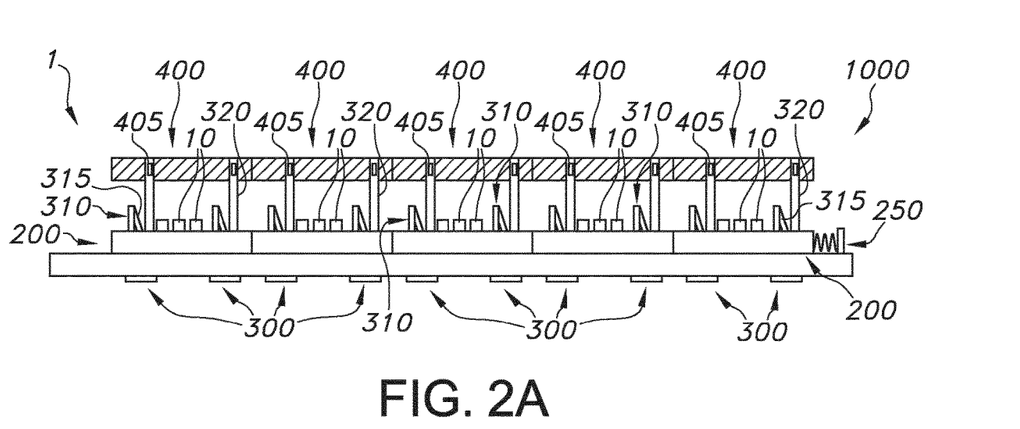
FIGS. 2a-2c schematically depict some further embodiments.

FIG. 2*a* schematically depicts an embodiment of the light generating system 1000, such as e.g. a lamp 1, comprising a single module support 200, but a plurality of LED modules 200 and connector elements 300, and also a plurality of optical elements 400.

Figure 2B:
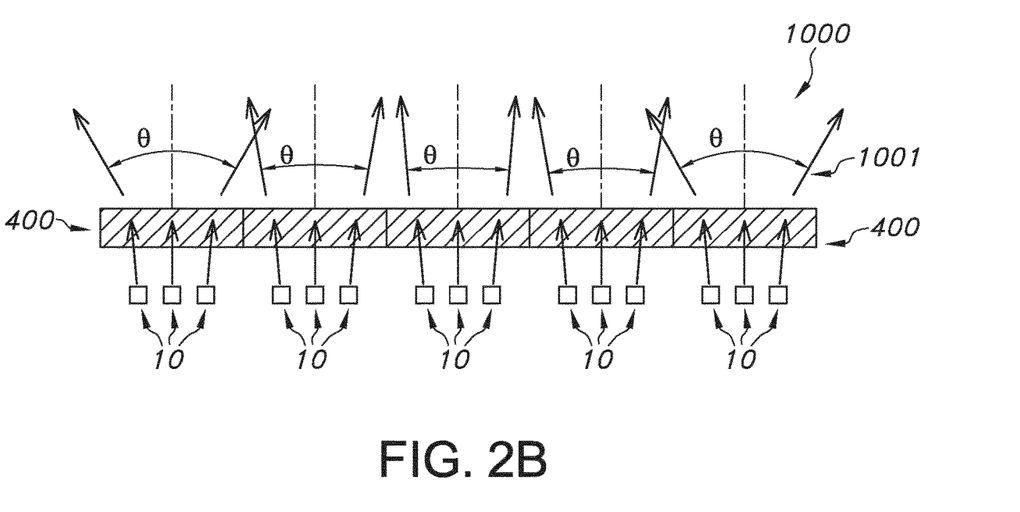

FIG. 2*b* schematically depicts that different optical elements 400 may impose different optical features to the light source light 11. Light escaping from the system is indicated with system light 1000, which may comprise at least part of the light source light 11. By way of example, different optical elements 400 may be configured to provide different beam shapes and/or beam directions. However, this is not necessarily the case.

Figure 2C:
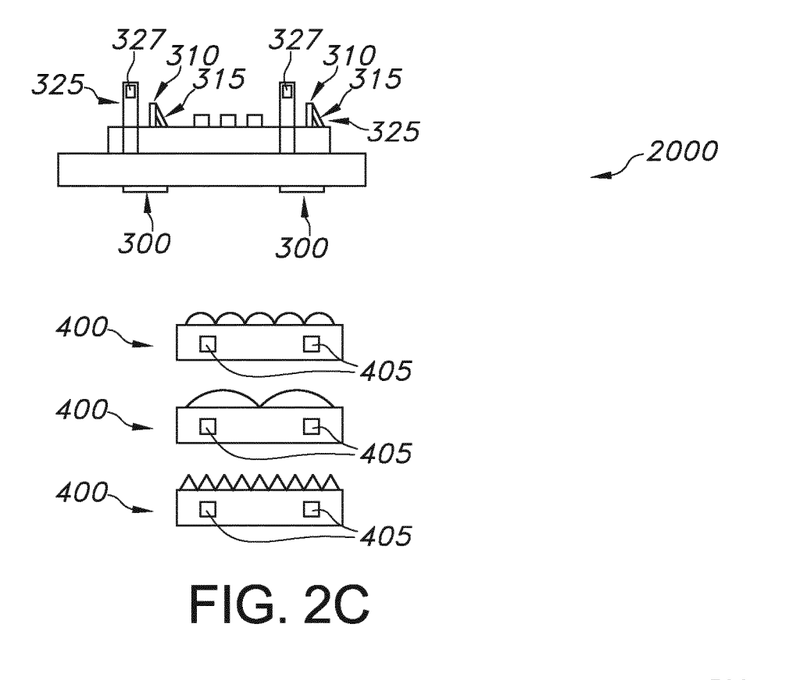

FIG. 2*c* schematically depicts an embodiment of a kit 2000 of parts comprising the light generating system 1000 and two or more different optical elements 400. The different optical elements 400 may be configured to provide different beam shapes and/or beam directions (see also FIG. 2*b*).

Figure 3:
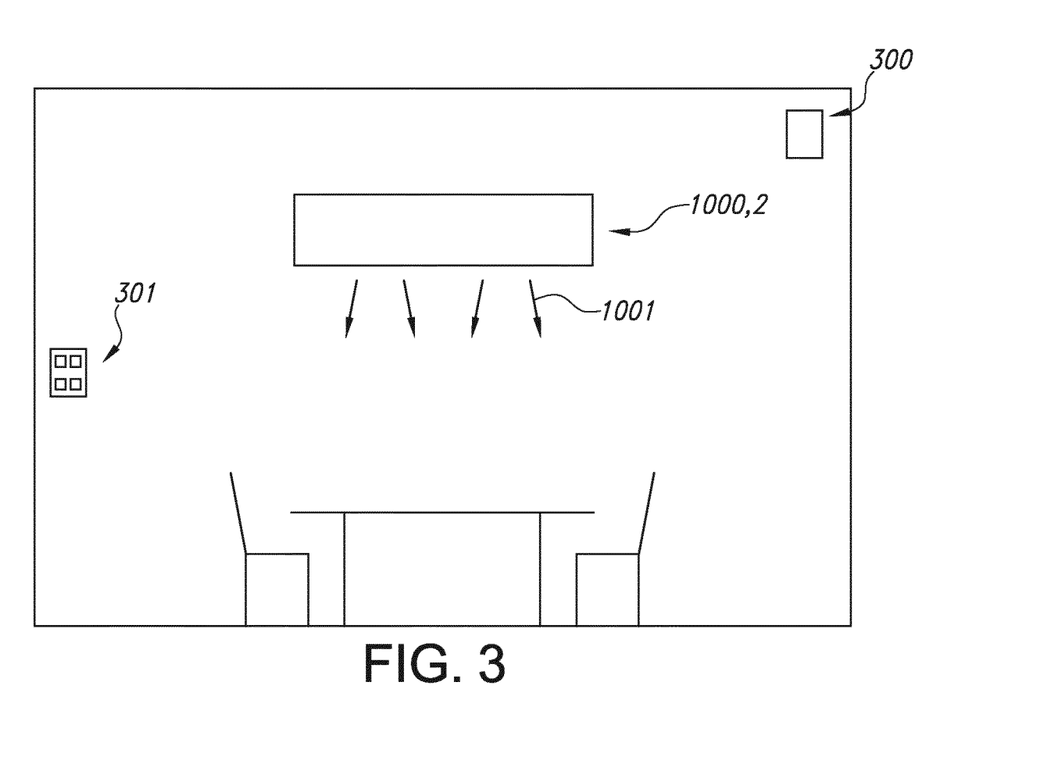
FIG. 3 schematically depicts yet a further embodiment (and application).

FIG. 3 schematically depicts an embodiment of a luminaire 2 comprising the light generating system 1000 as defined herein. Reference 301 indicates a user interface, such as a graphical user interface, which may be functionally coupled with the control system 300 comprised by or functionally coupled to the lighting system 1000. The luminaire 2 may further comprise louvres, etc.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" also includes embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light generating system comprising a LED module, a module support, and a connector element, wherein:
   the module support comprises a first module support opening for hosting at least part of a first connector element part, and the module support comprises one or more second module support openings for hosting at least parts of one or more second connector element parts;
   the LED module comprises a LED support and a plurality of LEDs functionally coupled to the LED support, wherein the LED support comprises a LED support opening for hosting at least part of the first connector element part; and wherein the plurality of LEDs are configured to generate light source light;

the connector element comprises the first connector element part, wherein the first connector element part comprises a first spring part, and the connector element comprises the one or more second connector element parts, wherein the one or more second connector element parts each comprise a resilient second part;

at least part of the first connector element part penetrates through the first module support opening; and the LED support opening, the first connector element part, and the module support are chosen such that in a functional coupling of the LED module and the module support, at least part of the first connector element part penetrates through the LED support opening, and the first spring part exerts a force on the LED module against the module support;

wherein the LED support further comprises a first LED support electrical conductor in electrical contact with one or more of the plurality of LEDs; wherein the first connector element part is electrically conductive, and wherein in the functional coupling of the connector element and the module support the first connector element part is in electrical contact with one or more of the plurality of LEDs via the first LED support electrical conductor; and wherein at least part of the first LED support electrical conductor is configured within 10 mm from the LED support opening, at least part of the one or more second connector element parts penetrate through the one or more second module support openings, and the one or more resilient second parts prevent a movement of the connector element and the module support relative to each other in a direction perpendicular to the connector element or the module support.

2. The light generating system according to claim 1, further comprising an optical element configured to beam shape and/or beam direct the light source light of one or more of the plurality of light sources.

3. The light generating system according to claim 2, wherein the optical element is supported by one or more of the one or more second connector element parts.

4. The light generating system according to claim 3, wherein the optical element and the one or more of the one or more second connector element parts comprise a click-connection.

5. The light generating system according to claim 2, wherein the optical element comprises a plurality of beam shaping elements configured to beam shape the light source light of two or more of the plurality of light sources.

6. A kit of parts comprising the light generating system according to claim 2 and two or more different optical elements.

7. The light generating system according to claim 1, wherein the connector element comprises at least two second connector element parts.

8. The light generating system according to claim 7, wherein the connector element comprises a plate shaped part from which the first connector element part and the at least two second connector element parts extend.

9. The light generating system according to claim 7, wherein the at least two second connector element parts are configured at both sides of the LED module.

10. The light generating system according to claim 1, wherein the second connector element part is electrically conductive and is configured in an electrically conductive connection with the first connector element part, wherein the second connector element part comprises an electrical connector element, wherein the electrical connector element is selected from the group consisting of a plug and a socket.

11. The light generating system according to claim 1, wherein the module support comprises a first face directed to the LED module and a second face directed away from the LED module, wherein a first part of the connector element is configured in physical contact with the second face of the module support, wherein there is no electrical contact between the connector element and the module support.

12. The light generating system according to claim 1, wherein the module support comprises the backside of a light generating device.

13. A lamp or a luminaire comprising the light generating system according to claim 1.

14. The light generating system according to claim 1, wherein the module support comprises the backside of a luminaire.

* * * * *